(12) United States Patent
Graumann et al.

(10) Patent No.: US 9,244,577 B2
(45) Date of Patent: Jan. 26, 2016

(54) MECHANISM FOR EMPLOYING AND FACILITATING PLACEMENT OF A SENSOR COVER OVER A CAPACITIVE CIRCUITRY SENSOR AT A COMPUTING DEVICE

(75) Inventors: David L. Graumann, Portland, OR (US); Jameson H. Williams, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 229 days.

(21) Appl. No.: 13/977,439

(22) PCT Filed: Sep. 30, 2011

(86) PCT No.: PCT/US2011/054413
§ 371 (c)(1),
(2), (4) Date: Jun. 28, 2013

(87) PCT Pub. No.: WO2013/048489
PCT Pub. Date: Apr. 4, 2013

(65) Prior Publication Data
US 2013/0278562 A1    Oct. 24, 2013

(51) Int. Cl.
*G06F 3/041* (2006.01)
*G06F 3/044* (2006.01)
*H03K 17/96* (2006.01)

(52) U.S. Cl.
CPC .............. *G06F 3/044* (2013.01); *H03K 17/962* (2013.01)

(58) Field of Classification Search
CPC .. G06F 3/044; H03K 17/962; H03K 17/9622; H03K 17/9618; H03K 2017/9602; H03K 2017/9604

USPC .................................................. 345/173, 174
See application file for complete search history.

(56) References Cited

U.S. PATENT DOCUMENTS

| | | | |
|---|---|---|---|
| 2007/0070047 A1* | 3/2007 | Jeon et al. | 345/173 |
| 2009/0073138 A1* | 3/2009 | Lee et al. | 345/173 |
| 2010/0079395 A1 | 4/2010 | Kim et al. | |
| 2011/0232976 A1 | 9/2011 | Osianach et al. | |
| 2012/0092250 A1* | 4/2012 | Hadas et al. | 345/156 |

FOREIGN PATENT DOCUMENTS

| | | | |
|---|---|---|---|
| JP | 2007-310684 | | 11/2007 |
| KR | 10-2011-0068666 | | 6/2011 |
| KR | 2011068666 A | * | 6/2011 |

OTHER PUBLICATIONS

PCT/US2011/054413, Notification of Transmittal of the International Search Report and the Written Opinion of the International Searching Authority, mailed Apr. 10, 2012, 9 pages.

* cited by examiner

*Primary Examiner* — Adam R Giesy
(74) *Attorney, Agent, or Firm* — Blakely, Sokoloff, Taylor & Zafman LLP

(57) ABSTRACT

A mechanism is described for employing and facilitating placing a sensor cover over an external sensor of a computing device. A method of embodiments of the invention includes sensing, at a sensor of a computing device, user touches to an outer surface of an impregnated sensor cover placed over the sensor, wherein the sensor cover includes a plurality of holes through the outer surface and a plurality of conductive leads corresponding to the plurality of holes, and wherein sensing is performed through one or more of the plurality of holes and their one or more corresponding conductive leads; and facilitating an action in response to each of the sensed user touches.

15 Claims, 5 Drawing Sheets

US 9,244,577 B2

MECHANISM FOR EMPLOYING AND FACILITATING PLACEMENT OF A SENSOR COVER OVER A CAPACITIVE CIRCUITRY SENSOR AT A COMPUTING DEVICE

CROSS-REFERENCE TO RELATED APPLICATION

This patent application is a U.S. National Phase Application under 35 U.S.C. §371 of International Application No. PCT/US2011/054413, filed Sep. 30, 2011, entitled MECHANISM FOR EMPLOYING AND FACILITATING PLACEMENT OF A SENSOR COVER OVER A CAPACITIVE CIRCUITRY SENSOR AT A COMPUTING DEVICE.

FIELD

The field relates generally to computing devices and, more particularly, to employing a mechanism for employing and facilitating placement of a sensor cover over a capacitive circuitry sensor at a computing device.

BACKGROUND

With the increase in the use of mobile device, it is getting increasingly important to make these devices easy to use (e.g., using touch panels) but without having to increase the cost, size or complexity and/or reduce value, efficiency or existing features. None of the current technologies satisfy the aforementioned standards. For example, one way to increase touch panel sensitivity or functionality is to add a number of extra components to the device (e.g., a microcontroller, Central Processing Unit (CPU) drivers, cables or connectors, etc.) which results in increased cost, size, complexity, etc. Further, with additional functionalities, computing devices are getting increasingly complex and difficult operate. Further, the increasing thinness of computing devices is making it extremely difficult for these computing devices to employ a circuitry that can support such additional functionalities.

BRIEF DESCRIPTION OF THE DRAWINGS

Embodiments of the present invention are illustrated by way of example and not by way of limitation in the figures of the accompanying drawings, in which like references indicate similar elements and in which.

DETAILED DESCRIPTION

Embodiments of the invention provide a mechanism for employing and facilitating placing a sensor cover over an external sensor of a computing device. A method of embodiments of the invention includes sensing, at a sensor of a computing device, user touches to an outer surface of an impregnated sensor cover placed over the sensor, wherein the sensor cover includes a plurality of holes through the outer surface and a plurality of conductive leads corresponding to the plurality of holes, and wherein sensing is performed through one or more of the plurality of holes and their one or more corresponding conductive leads; and facilitating an action in response to each of the sensed user touches.

In one embodiment, the physical size of a sensor of a computing device (e.g., a touch sensor on the side or on the front a mobile computing device) is maintained by adding capacitive characteristics to an enclosure (e.g., sensor cover) itself that is placed over the sensor. Currently, manufacturers of touch panels and touch pads have to shrink their flat pad dimensions and place other dimensions on the reduced-sized flat pad or, alternatively, the sensor is to be made too narrow with diminished width resolution of thumb or finger movement over the sensor to reduce the overall utility of the sensor and is extremely undesirable. Embodiments of the present invention provide placing a sensor cover over the sensor (without changing the size or dimension of the sensor) which eliminates the limitations of the conventional techniques. In one embodiment, the sensor cover may be made of plastic having various conductive properties having capacitive coupling capabilities to facilitate a novel packaging of plastic cover sensor and with the sensor using, for example, glue. For example, the plastic cover sensor may be shaped to securely cover the sensor for linearization transform.

Figure 1A:
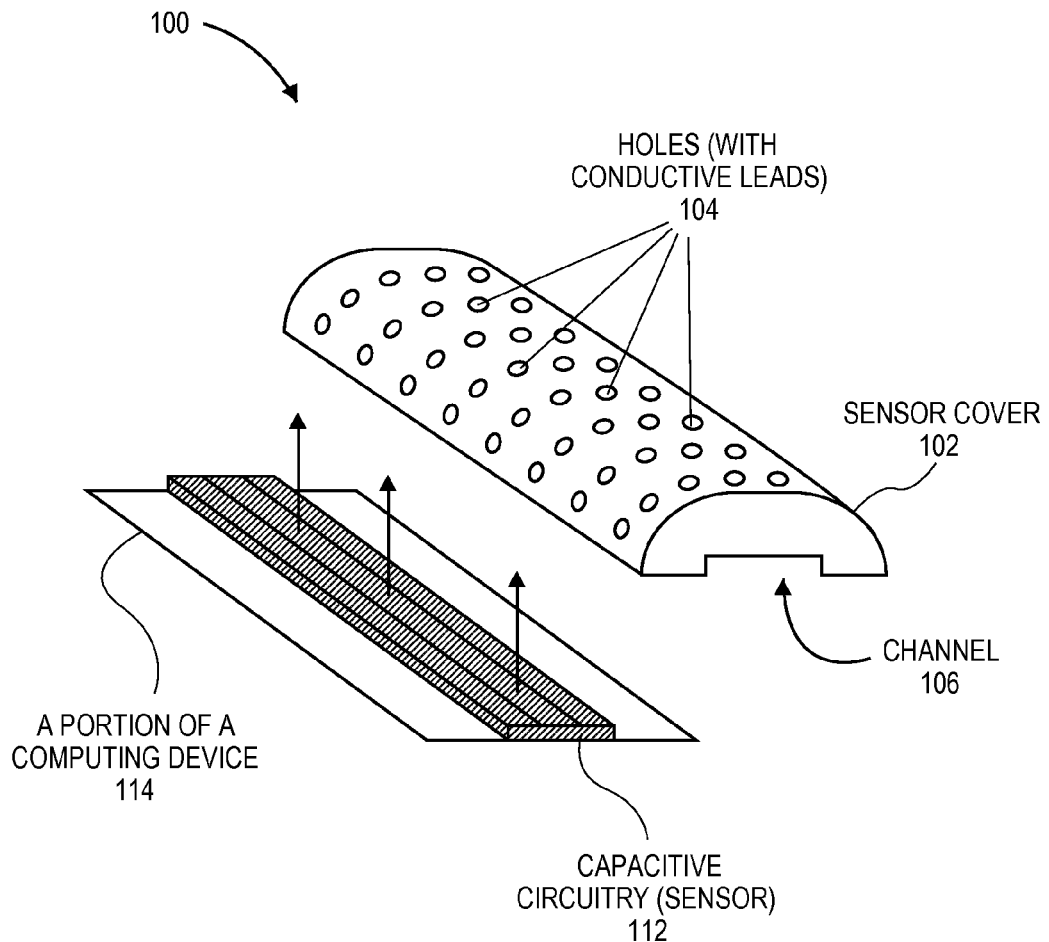
FIGS. 1A-1B illustrate a placement mechanism for facilitating placement of a sensor cover to cover a capacitive circuitry according to one embodiment of the invention.

FIG. 1A illustrates a placement mechanism for facilitating placement of a sensor cover to cover a capacitive circuitry according to one embodiment of the invention. In one embodiment, the placement mechanism 100 provides a sensor cover 102 to be placed over a capacitive circuitry ("sensor") 112 (e.g., a thumb sensor on the side of a mobile computing device) to facilitate a small and tightly-integrated sensor 112 that can be covered with the sensor cover 102 which provides a bigger area for the user to use the sensor 112. For example, in one embodiment, the sensor cover 102 may be made of plastic having holes 104 with conductive leads and a channel 106 to seamlessly accommodate the sensor 112. The sensor cover 102 and the sensor 112 may be sealed together by, for example, placing the sensor cover 102 on the portion 114 of the computing system using a joining substance, such as a type of apoxy or adhesive glue. This kind of seamless sealing can protect the sensor 112 against air, moisture, shifting, and other substances that can potentially hurt or deteriorate the sensor 112.

In one embodiment, the sensor cover 102 may be made with a type of plastic or, in some embodiments, other forms of material may be used, such as electronic textiles (e.g., fabric, woven plastic) to properly transmit heat, power, data, and the like. Sensor cover 102 may be used over a sensor 112 exposed on a computing device, such as computing device 400 of FIG. 4, and may include a mobile computing device, such as a smartphone (e.g., iPhone®, BlackBerry®, etc.), a handheld computing device, a personal digital assistant (PDA), a tablet computer (e.g., iPad®, Samsung® Galaxy Tab®, etc.), a laptop computer (e.g., notebooks, netbooks, etc.), and other similar mobile computing devices, etc. Computing device may further include desktop computers, set-top boxes (e.g., Internet-based cable television set-top boxes, etc.). Computing device may further include an operating system serving as an interface between any hardware or physical resources of the computer device and a user. Computing device may further include one or more processors, memory devices, network devices, drivers, or the like. It is to be noted that terms like "machine", "device", "computing device", "computer", "computing system", and the like, are used interchangeably and synonymously throughout this document.

With mobile computing devices getting smaller and narrower, maintaining a smaller sensor (e.g., human finger sized sensor) is becoming more desirable. Embodiments of the present invention provide the sensor cover 102 to encase the sensor 112 while maintaining the size of the sensor 112 such that that the size of the sensor cover 102 may be changed than rather than the size of the sensor 112. Naturally, changing the size of the plastic sensor cover 102 can be much easier than changing the size of the electronic sensor 112 due to, for example, the complexity (e.g., capacitive wiring, etc.) of manufacturing the sensor 112 as opposed to simply manufacturing a plastic-based sensor cover 102. Further, the sensor 102 can be manufactured separately from the sensor 112 that is manufactured as part of the computing device.

Figure 1B:
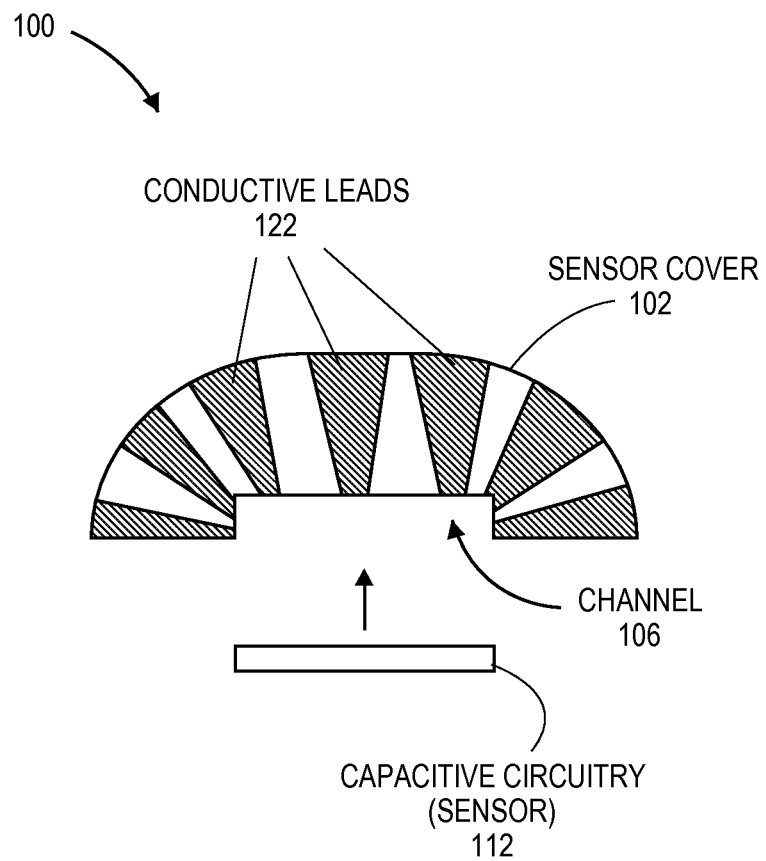

In one embodiment, as shown with regard to FIG. 1B, an array of conductive leads 122 is provided through the enclosure or channel 106 of the sensor cover 102. As aforementioned and referring back to FIG. 1A, these conductive leads are exposed through a number of holes 104 exposed on the top surface of the sensor cover 102 to fan out the sensor 112 regardless of its size, such as a small embedded sensor surface area to the edge of the plastic-based sensor cover 102. The sensor cover 102 is made with an array of holes 104 corresponding to the array of conductive leads 122 such that each of the holes 104 is filled with conductive epoxy to form the conductive leads 122 and then placed in direct contact with the underside of the plastic top of the sensor cover 102. For example, this can be achieved by placing the sensor 112 into the channel 106 or by turning the sensing Printed Circuit Board (PCB) longer edge perpendicular to the plastics and making longer conductive leads 122 to match.

The plastics used to make the sensor cover 102 may be of a high dialectic material to avoid leakage from conductive lead 122 to conductive lead 122. The sensor 112 may then be used to produce X, Y location values. To compensate for the surface differences between the arched plastic's outer side and the flat PCB sensing elements, an X, Y transform is performed before exposing to a computing unit of the computing device.

Figure 2:
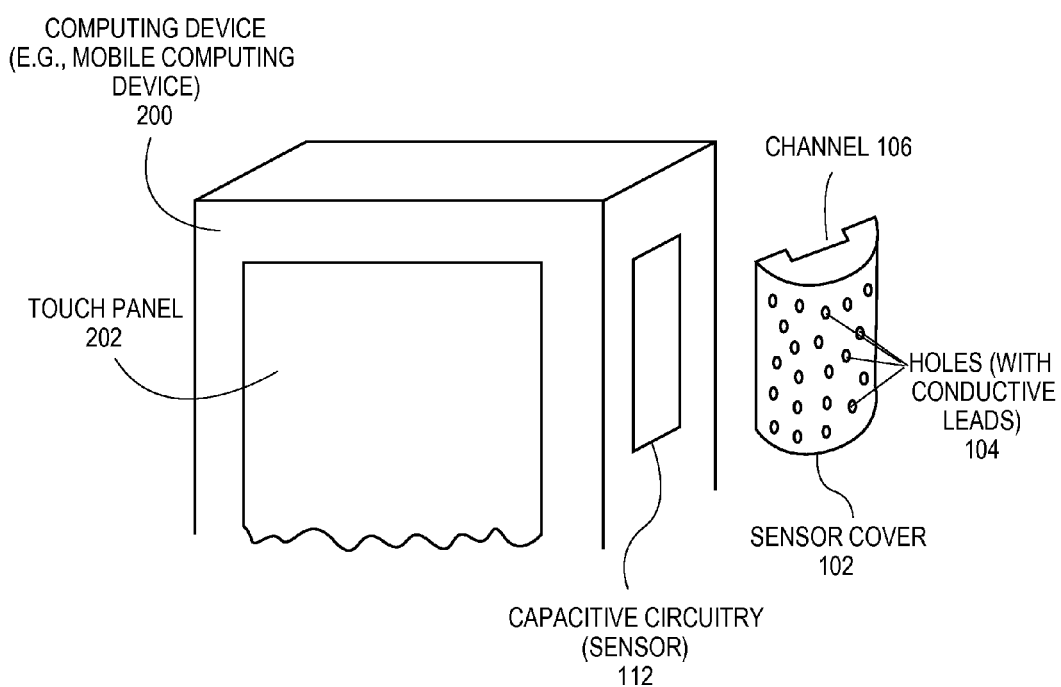
FIG. 2 illustrates a computing device employing a sensor and a sensor cover having a channel and holes leading to conductive leads according to one embodiment of the invention.

FIG. 2 illustrates a computing device 200 employing a sensor 112 and a sensor cover 102 having a channel 106 and holes 104 leading to conductive leads according to one embodiment of the invention. In the illustrated embodiment, the sensor 112 is provided as, for example, a thumb sensor placed on a right side of the computing device 200 and at a 90 degree angel from the touch panel 202. In one embodiment, each time the user touches (e.g., presses, rolls, rubs, flicks, etc.) the sensor cover 102, the user touch is sensed by the sensor 112 through the holes 104 and via the conductive leads of the sensor cover 102. It is contemplated that the touch is then received, analyzed and interpreted by various components or modules associated with the sensor and/or one or more sensing/signaling mechanisms employed by the computing device 200.

Figure 3:
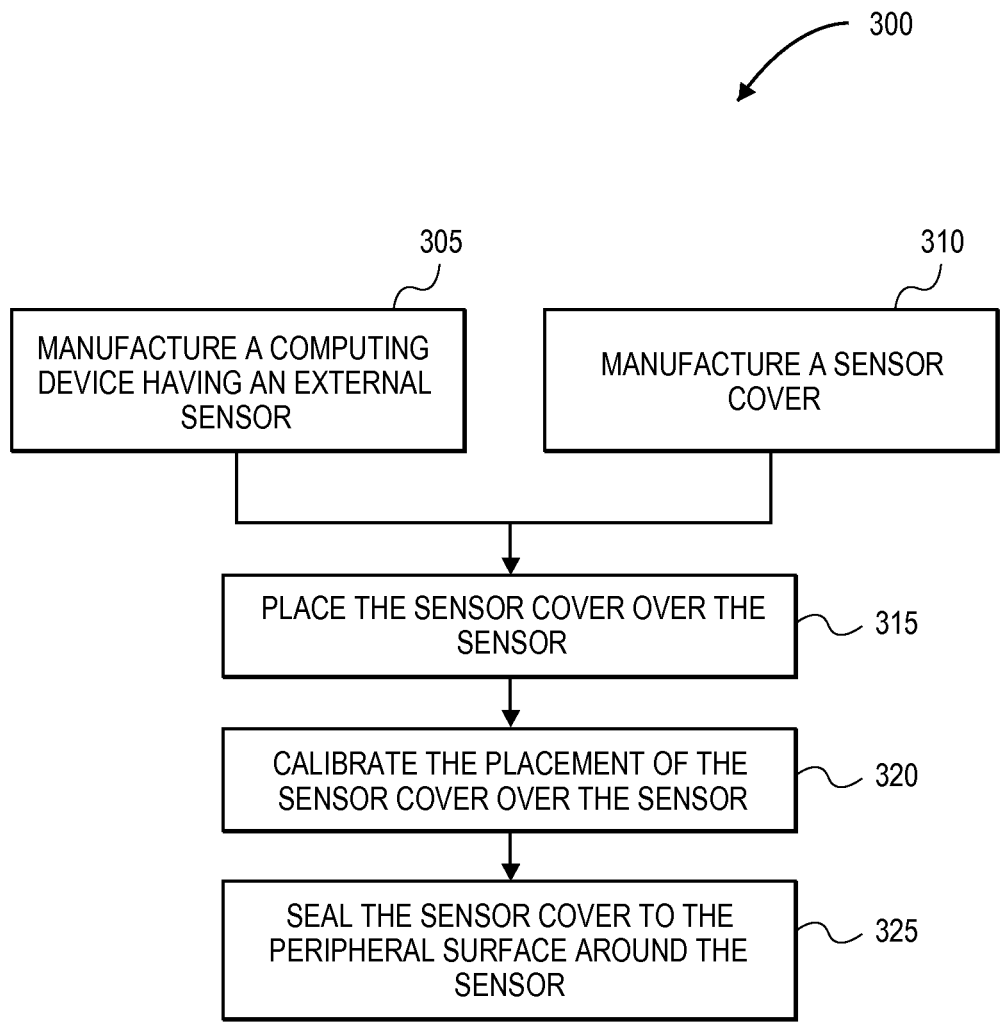
FIG. 3 illustrates a method illustrating a placement mechanism for employing and facilitating a sensor cover over a sensor of a computing device according to one embodiment of the invention.

FIG. 3 illustrates a method illustrating a placement mechanism for employing and facilitating a sensor cover over a sensor of a computing device according to one embodiment. Method 300 may be performed by any number of manufacturing techniques and equipment having processing logic that may comprise hardware (e.g., circuitry, dedicated logic, programmable logic, etc.), software (such as instructions run on a processing device), or a combination thereof. In one embodiment, method 300 is performed in light of the illustrations of FIGS. 1A, 1B and 2.

Method 300 starts at processing block 305 with manufacturing of a computing device (e.g., a mobile computing device, such as a smartphone, a tablet computing device, etc.) having various a touchpad or touch panel as well as a sensor, such as a thumb sensor or thumb pad, somewhere visible on the computing device (e.g., on the left or right side of the computing device). Similarly, at processing block 310, sensor cover is manufactured at any number of manufacturing facilities that may or may not be related to the manufacturing facilities where the computing device is made. The sensor cover may be made using any number of appropriate materials, such as a type of plastic, electronic textiles, etc.

In one embodiment, at processing block 315, the sensor cover is placed over the sensor. At processing block 320, the placement is then calibrated such that conductive leads of the sensor cover and the sensor cover itself are properly placed on and calibrated with the sensor to facilitate fanning out and proper use of the sensor. In one embodiment, the sensor cover may include a number of holes (corresponding to the conductive leads) exposing the sensor to the outside environment as well as the user's touch such the sensor may sense the user's touch each time the user touches (e.g., rolls, presses, flicks, etc.) the top of the sensor cover placed on the sensor. At processing block 325, in one embodiment, the sensor cover is sealed to the peripheral surface (of the computing device) surrounding the sensor using a type of glue, etc.

Figure 4:
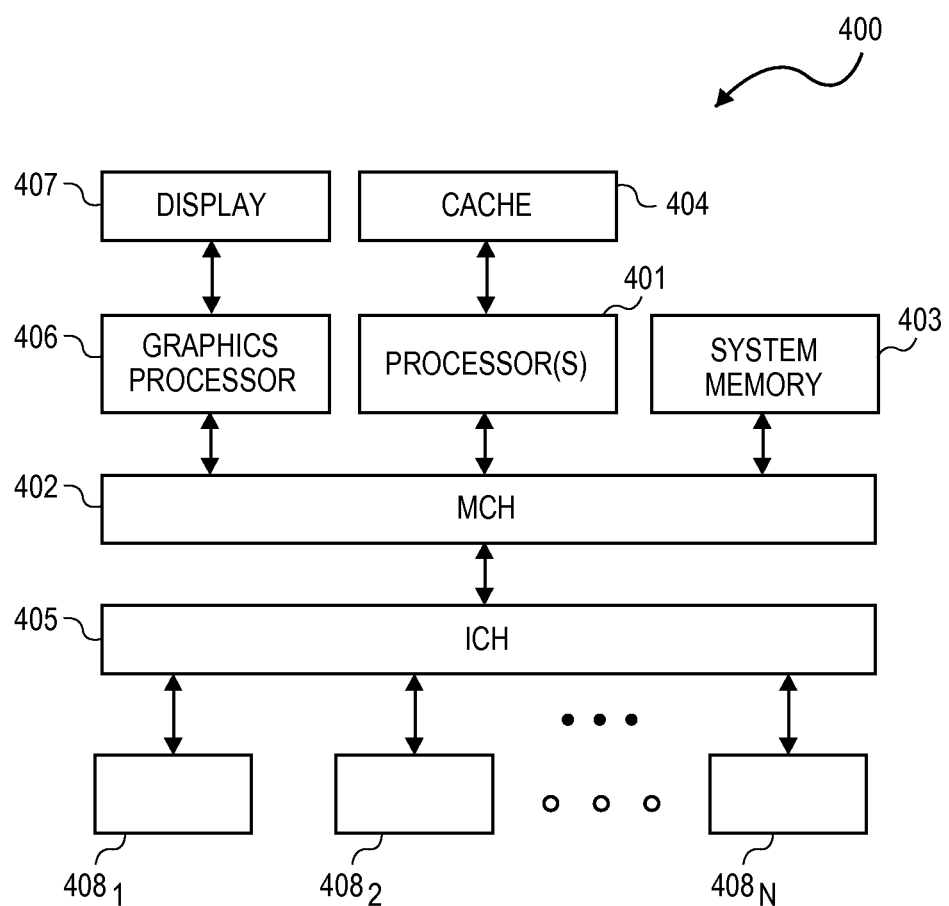
FIG. 4 illustrates a computing system according to one embodiment of the invention.

FIG. 4 illustrates a computing system 400 employing and facilitating a cover sensor over a sensor of the computing system according to one embodiment of the invention. The exemplary computing system 400 may be the same as or similar to the computing device 200 of FIG. 2 and include: 1) one or more processors 401 at least one of which may include features described above; 2) a memory control hub (MCH) 402; 3) a system memory 403 (of which different types exist such as double data rate RAM (DDR RAM), extended data output RAM (EDO RAM) etc.); 4) a cache 404; 5) an input/output (I/O) control hub (ICH) 405; 6) a graphics processor 406; 7) a display/screen 407 (of which different types exist such as Cathode Ray Tube (CRT), Thin Film Transistor (TFT), Light Emitting Diode (LED), Molecular Organic LED (MOLED), Liquid Crystal Display (LCD), Digital Light Projector (DLP), etc.; and 8) one or more I/O devices 408.

The one or more processors 401 execute instructions in order to perform whatever software routines the computing system implements. The instructions frequently involve some sort of operation performed upon data. Both data and instructions are stored in system memory 403 and cache 404. Cache 404 is typically designed to have shorter latency times than system memory 403. For example, cache 404 might be integrated onto the same silicon chip(s) as the processor(s) and/or constructed with faster static RAM (SRAM) cells whilst system memory 403 might be constructed with slower dynamic RAM (DRAM) cells. By tending to store more frequently used instructions and data in the cache 404 as opposed to the system memory 403, the overall performance efficiency of the computing system improves.

System memory 403 is deliberately made available to other components within the computing system. For example, the data received from various interfaces to the computing system (e.g., keyboard and mouse, printer port, Local Area Network (LAN) port, modem port, etc.) or retrieved from an internal storage element of the computer system (e.g., hard disk drive) are often temporarily queued into system memory 403 prior to their being operated upon by the one or more processor(s) 401 in the implementation of a software program. Similarly, data that a software program determines should be sent from the computing system to an outside entity through one of the computing system interfaces, or stored into an internal storage element, is often temporarily queued in system memory 403 prior to its being transmitted or stored.

The ICH 405 is responsible for ensuring that such data is properly passed between the system memory 403 and its appropriate corresponding computing system interface (and internal storage device if the computing system is so designed). The MCH 402 is responsible for managing the various contending requests for system memory 403 accesses amongst the processor(s) 401, interfaces and internal storage elements that may proximately arise in time with respect to one another. In one embodiment, the MCH 502 and ICH 505 may not be separately employed; but rather, be provided as part of a chipset that includes the MCH 502, ICH 505, other controller hubs, and the like.

One or more I/O devices 408 are also implemented in a typical computing system. I/O devices generally are responsible for transferring data to and/or from the computing system (e.g., a networking adapter); or, for large scale non-volatile storage within the computing system (e.g., hard disk drive). ICH 405 has bi-directional point-to-point links between itself and the observed I/O devices 408.

Portions of various embodiments of the present invention may be provided as a computer program product, which may include a computer-readable medium having stored thereon computer program instructions, which may be used to program a computer (or other electronic devices) to perform a process according to the embodiments of the present invention. The machine-readable medium may include, but is not limited to, floppy diskettes, optical disks, compact disk read-only memory (CD-ROM), and magneto-optical disks, ROM, RAM, erasable programmable read-only memory (EPROM), electrically EPROM (EEPROM), magnet or optical cards, flash memory, or other type of media/machine-readable medium suitable for storing electronic instructions.

The techniques shown in the figures can be implemented using code and data stored and executed on one or more electronic devices (e.g., an end station, a network element). Such electronic devices store and communicate (internally and/or with other electronic devices over a network) code and data using computer-readable media, such as non-transitory computer-readable storage media (e.g., magnetic disks; optical disks; random access memory; read only memory; flash memory devices; phase-change memory) and transitory computer-readable transmission media (e.g., electrical, optical, acoustical or other form of propagated signals—such as carrier waves, infrared signals, digital signals). In addition, such electronic devices typically include a set of one or more processors coupled to one or more other components, such as one or more storage devices (non-transitory machine-readable storage media), user input/output devices (e.g., a keyboard, a touchscreen, and/or a display), and network connections. The coupling of the set of processors and other components is typically through one or more busses and bridges (also termed as bus controllers). Thus, the storage device of a given electronic device typically stores code and/or data for execution on the set of one or more processors of that electronic device. Of course, one or more parts of an embodiment of the invention may be implemented using different combinations of software, firmware, and/or hardware.

In the foregoing specification, the invention has been described with reference to specific exemplary embodiments thereof. It will, however, be evident that various modifications and changes may be made thereto without departing from the broader spirit and scope of the invention as set forth in the appended claims The Specification and drawings are, accordingly, to be regarded in an illustrative rather than a restrictive sense.

We claim:

1. A method comprising:
    placing an outer sensing surface over a sensor of a computing device, wherein the outer sensing surface to serve as an enclosure over the sensor and wherein the outer sensing surface is impregnated with a plurality of holes corresponding to a plurality of conductive lines leading to the sensor;
    sensing a user touch to the outer sensing surface, wherein sensing is performed through one or more of the plurality of holes and correspondingly through one or more of the plurality of conductive leads such that the outer sensing surface serves to replace the sensor while the sensor remains untouched and unaltered; and
    facilitating an action in response to the user touch.

2. The method of claim 1, wherein the outer sensing surface is made with a conductive material including plastic or electronic textile.

3. The method of claim 1, wherein placing comprises sealing, via glue, the outer sensing surface to a surface area surrounding the sensor such that the sensor resides entirely within a channel of the sensor cover and one or more conductive leads of the sensor are calibrated with the plurality of conductive leads of the outer sensing surface.

4. The method of claim 1, wherein the sensor comprises a thumb sensor externally placed to a side of the computing device, wherein the thumb sensor is capable of being triggered to perform one or more actions without being touched or altered and through user touches of the outer sensing surface.

5. The method of claim 1, wherein the computing device comprises a mobile computing device including one or more of a smartphone, a handheld computing device, a tablet computing device, and an e-reader, wherein the computing device further includes one or more of a notebook, a netbook, and a desktop computing device.

6. A non-transitory machine-readable medium including instructions that, when executed by a machine, cause the machine to:
    place an outer sensing surface over a sensor of a computing device, wherein the outer sensing surface to serve as an enclosure over the sensor and wherein the outer sensing surface is impregnated with a plurality of holes corresponding to a plurality of conductive lines leading to the sensor;
    sense a user touch to the outer sensing surface, wherein sensing is performed through one or more of the plurality of holes and correspondingly through one or more of the plurality of conductive leads such that the outer sensing surface serves to replace the sensor while the sensor remains untouched and unaltered; and
    facilitate an action in response to the user touch.

7. The non-transitory machine-readable medium of claim 6, wherein the outer sensing surface is made with a conductive material including plastic or electronic textile.

8. The non-transitory machine-readable medium of claim 6, wherein placing comprises sealing, via glue, the outer sensing surface to a surface area surrounding the sensor such that the sensor resides entirely within a channel of the sensor cover and one or more conductive leads of the sensor are calibrated with the plurality of conductive leads of the outer sensing surface.

9. The non-transitory machine-readable medium of claim 6, wherein the sensor comprises a thumb sensor externally placed to a side of the computing device, wherein the thumb sensor is capable of being triggered to perform one or more actions without being touched or altered and through user touches of the outer sensing surface.

10. The non-transitory machine-readable medium of claim 6, wherein the computing device comprises a mobile computing device including one or more of a smartphone, a handheld computing device, a tablet computing device, and an e-reader, wherein the computing device further includes one or more of a notebook, a netbook, and a desktop computing device.

11. An apparatus comprising:
  an outer sensing surface placed over a sensor, wherein the outer sensing surface to serve as an enclosure over the sensor and wherein the outer sensing surface is impregnated with a plurality of holes corresponding to a plurality of conductive lines leading to the sensor,
  wherein the outer sensing surface to sense a user touch, wherein sensing is performed through one or more of the plurality of holes and correspondingly through one or more of the plurality of conductive leads such that the outer sensing surface serves to replace the sensor while the sensor remains untouched and unaltered, and
  wherein an action is facilitated in response to the user touch.

12. The apparatus of claim 11, wherein the outer sensing surface is made with a conductive material including plastic or electronic textile.

13. The apparatus of claim 11, wherein the outer sensing surface is placed over the sensor by sealing, via glue, the outer sensing surface to a surface area surrounding the sensor such that the sensor resides entirely within a channel of the sensor cover and one or more conductive leads of the sensor are calibrated with the plurality of conductive leads of the outer sensing surface.

14. The apparatus of claim 11, wherein the sensor comprises a thumb sensor externally placed to a side of the computing device, wherein the thumb sensor is capable of being triggered to perform one or more actions without being touched or altered and through user touches of the outer sensing surface.

15. The apparatus of claim 11, wherein the apparatus comprises a computing device having a mobile computing device including one or more of a smartphone, a handheld computing device, a tablet computing device, and an e-reader, wherein the computing device further includes one or more of a notebook, a netbook, and a desktop computing device.

* * * * *